United States Patent [19]  [11]  4,438,551
Imai  [45]  Mar. 27, 1984

[54] LOCKING DEVICE FOR VEHICLE SEAT BELT WEBBING

[75] Inventor: Hironobu Imai, Chigasaki, Japan

[73] Assignee: NSK-Warner K.K., Japan

[21] Appl. No.: 345,413

[22] Filed: Feb. 3, 1982

[30] Foreign Application Priority Data

Feb. 27, 1981 [JP] Japan .......................... 56-26804[U]

[51] Int. Cl.³ .................. A62B 35/02; B65H 75/48
[52] U.S. Cl. ........................ 24/68 SB; 242/107.2;
242/107.4 A; 242/107.4 B; 280/806; 297/479;
297/478
[58] Field of Search ............. 242/107.2, 107.4 A,
242/107.4 B; 280/806, 807, 808; 297/476, 478,
479; 24/68 SB

[56] References Cited
U.S. PATENT DOCUMENTS

| | | | |
|---|---|---|---|
| 3,467,337 | 9/1969 | Putman | 242/107.4 B |
| 4,083,511 | 4/1978 | Ikesue | 242/107.4 B |
| 4,208,770 | 6/1980 | Takada | 280/806 |
| 4,249,708 | 2/1981 | Asano | 242/107.4 A |
| 4,306,735 | 12/1981 | Pfeiffer et al. | 280/806 |
| 4,319,667 | 3/1982 | Motonami et al. | 242/107.2 |
| 4,327,881 | 5/1982 | Föhl | 242/107.2 |
| 4,378,915 | 4/1983 | Föhl | 280/806 |

Primary Examiner—Gene Mancene
Assistant Examiner—David I. Tarnoff
Attorney, Agent, or Firm—McGlew and Tuttle

[57] ABSTRACT

Disclosed herein is a locking device for vehicle seat belt webbing. The device includes a fixed clamp member; a swing clamp displaceable relative to the clamp member between two positions, and a drum displaceable relative to the swing clamp between two positions and engageable at one of the two positions with the swing clamp so as to restrain itself from further rotation. The drum is displaced toward the swing clamp when a tensile force of a predetermined value or greater is applied to the webbing. When a further tensile force is exerted on the webbing, the swing clamp is displaced toward the fixed clamp member and holds the webbing firmly. Since the drum itself is locked, subsequent payout of the webbing can be substantially restrained owing to a frictional force developed between the drum and webbing. Thus, the webbing is actually locked at two locations. Since the area of contact between the webbing and the locking device, i.e., the clamp member and swing clamp as well as the drum is rather great, it is possible to avoid the centralization of the locking force. This is certainly important to protect the webbing from being cut up. As the locking device does not rely upon many guide rollers, the webbing can be pulled out with a relatively small power.

5 Claims, 4 Drawing Figures

LOCKING DEVICE FOR VEHICLE SEAT BELT WEBBING

BACKGROUND OF THE INVENTION (1) Field of the Invention

This invention relates to a locking device for vehicle seat belt webbing.

(2) Description of the Prior Art

As a retractor for taking up the webbing of a seat belt mounted on a vehicle to restrain its occupant, there has heretofore generally been used a retractor, which normally permits free pay-out and take-up of the webbing and is equipped with emergency locking mechanism so as to prevent the pay-out of the webbing in case of emergency.

In many of such conventionally known retractors, the prevention of pay-out of the webbing is generally done by winding the webbing up on a reel journalled on a housing and stopping the rotation of the reel by locking means in case of emergency. They are thus accompanied by a drawback that the occupant may not be satisfactorily protected as the webbing is not per se directly locked and may still be paid out of the retractor by a length equivalent to that available from tightening a webbing portion wound up on the reed even after the rotation of the reel has been stopped. This drawback is a serious problem when such a conventional retractor is mounted on a small car, the interior space of which is inherently limited. Namely, since the distance between an occupant of a small car and the steering wheel, instrument panel or windshield thereof is rather short, the occupant may hit the steering wheel or the like and be seriously hurt by a pay-out of the webbing due to the tightening of the webbing portion on the reel. The cope with the above-described problem, it has recently been proposed to directly lock the webbing per se at the outlet of a retractor.

However, such a retractor has been found unsatisfactory as its webbing is kept in frictional contact with clamping means even during its normal use and cannot be handled smoothly. A further proposal has also been made with a view toward solving the above new problem by providing many guide rollers in the vicinity of the clamping means. Although the latter proposal was successful to an extent in improving the handling of the webbing, it has been found to be still unsatisfactory due to complication of its structure resulting from the arrangement of many rollers and increased frictional resistance at the rollers.

As examples of locking devices equipped with many guide rollers, reference may be made to U.S. Pat. Nos. 3,439,932 and 3,442,529 issued respectively Apr. 22 and May 6, 1960 to Gerald R. Lewis et al. These U.S. patents disclose a counterweight in place of a reel-type retractor which is generally used for automobile seat belts. Needless to say, the locking device described in each of these U.S. patents may be applied in combination with such a reel-type retractor. In the above U.S. patents, a pair of mutually opposing guide rollers are provided. One of the guide rollers is fixed while the other guide roller is disposed displaceable relative to the former guide roller. Both rollers are provided with clamp members, between which the webbing is clamped when the other roller is displaced toward its counterpart roller. The locking of the webbing is dependent on the clamp means only, because the guide rollers are not locked but allowed to rotate. Thus, the webbing may not be sufficiently locked. Furthermore, the webbing may be cut up by the clamp members because the locking force is not distributed by rather centralized.

As another example of prior art locking devices, U.S. Pat. No. 4,128,261 issued Dec. 5, 1978 to Hannu O. Paitula and assigned to Gränges Essem Aktiebolag Fack may be referred to. It discloses a locking mechanism comprising a stop means, a non-displaceable roller and a roller which is displaceable relative to both stop means and non-displaceable roller. Although the non-displaceable roller can be locked by a locking device, which is actuated by a sudden acceleration or deceleration of a vehicle, the displaceable roller is not provided with any locking means. Thus, the circumferential surface of the displaceable roller may not be used effectively for restraining the webbing from being paid out. In view of the configurations of the stop means and both rollers, the restraining force is exerted on the webbing principally at two locations only, in other words, between the stop means and displaceable roller and between the displaceable roller and non-displaceable roller, thereby involving a potential danger that the webbing may be cut up there.

U.S. Pat. No. 3,871,599 issued Mar. 18, 1975 to Takezo Takada and assigned to Takata Kojyo Co., Ltd. discloses a locking mechanism, in which the rotation of a guide roller equipped with gears is stopped by means of a locking member having racks and a clamp member. However, the interlocking between the guide roller and the locking member is performed via the webbing, thereby making the locking of the guide roller insufficient. As in the above prior art references, the webbing is clamped at a narrow area between the guide roller and clamp member and it is thus open to considerable damage. In addition, the webbing is bent at a sharp angle by the clamp member and the locking force is centralized at the bent portion. Therefore, the webbing is susceptible of being cut up at the bent portion.

Finally, U.S. Pat. No. 4,249,708 issued Feb. 10, 1981 to Schuichi Asano and assigned to Nippon Seiko Kabushiki Kaishi is also referred to. It discloses an emergency locking mechanism adapted to lock a roller per se. This mechanism appears to be more effective than those disclosed in the above prior art references in that it makes an effective use of the contact between the circumferential surface of the roller and the webbing to restrain the webbing from being paid out. However, similar to the above prior art locking devices or mechanisms, the contact between the roller and fixed plate which serves as a clamp member takes place in the form of a line, thereby resulting in a centralization of the clamping force and possibly leading to the cutting of the webbing.

SUMMARY OF THE INVENTION

An object of this invention is to provide a locking device for vehicle seat belt webbing, which is free of the above-described drawbacks or problems of the prior art locking devices or mechanisms and permits easy and smooth handling of the webbing while assuring excellent locking performance.

The present inventor has unexpectedly found that the above object of this invention can be achieved by constructing a locking device for vehicle seat belt webbing in such a way that a drum, which serves to guide the webbing, is displaceable relative to a swing clamp and, when a tensile force of a predetermined level or greater is applied to the webbing, the drum is brought into engagement with the swing clamp and the swing clamp is then displaced together with the drum into abutment with a clamp member provided with a housing to lock the webbing therebetween.

The present invention thus provides, in one aspect thereof, a locking device for vehicle seat belt webbing which comprises a housing; a clamp member fixedly secured on the housing; a swing arm swingably supported on the housing; a swing clamp integrally secured on the swing arm and displaceable between a first position where the swing clamp permits free passage of the webbing and a second position where the webbing is clamped between the clamp member and swing clamp so as to restrain the webbing from movement; guide means adapted to guide the swing clamp from the first position to the second position; a drum rotatably mounted on a shaft, which extends between slots formed in the swing arm, and displaceable between a non-engagement position where the drum is disengaged from the swing clamp and an engagement position where the drum is engaged with the swing clamp and prevented from rotation; and the drum being displaceable from the non-engagement position to the engagement position when a tensile force of a predetermined value or greater is applied to the webbing and the swing clamp being displaceable together with the drum from the first position to the second position when a further tensile force is exerted on the webbing.

The swing clamp preferably defines an interlocking surface at a surface confronting the drum and the drum preferably defines a knurled circumferential surface, whereby, when the drum assumes the engagement position, this brings the interlocking surface into engagement with the knurled circumferential surface so as to restrain the drum from rotation.

It is also preferable that the swing clamp has substantially trigonal prism-like configurations and the device further comprises a guide roller so as to guide the swing clamp from the first position to the second position and firmly clamp the webbing by a wedge action of the swing clamp.

In a further aspect of this invention, the locking device may further comprise a take-up reel rotatably mounted on the housing, an acceleration sensing device for detecting a sudden speed change of a vehicle on which the device is to be mounted, and a locking means actuated by the sensing device to lock the take-up reel. For the purpose of this application, the term acceleration is used in its broader sense to include any change in velocity including deceleration.

The locking device of the present invention can bring about excellent effects that the handling of the webbing is easy and smooth because the webbing is normally guided by the freely-rotatable drum and the reliability of its webbing-locking performance has been improved as, in case of emergency, the drum is brought into engagement with the swing clamp to restrain the drum from any further rotation and thus to reduce the tensile force to be applied to the webbing where it is clamped and, when a further tensile force is exerted on the webbing, the swing clamp is displaced together with the drum to clamp the webbing between the swing clamp and clamp member firmly owing to the wedge action of the swing clamp. Since a tensile force to be applied to the webbing in case of emergency is taken up by the webbing at a relatively wide area, it is possible to distribute the tensile force and thus to protect the webbing from being cut up.

The above and other objects, features and advantages of the present invention will become more apparent from the following description and the appended claims, taken in conjunction with the accompanying drawings.

DETAILED DESCRIPTION OF THE INVENTION AND PREFERRED EMBODIMENT

Figure 1:
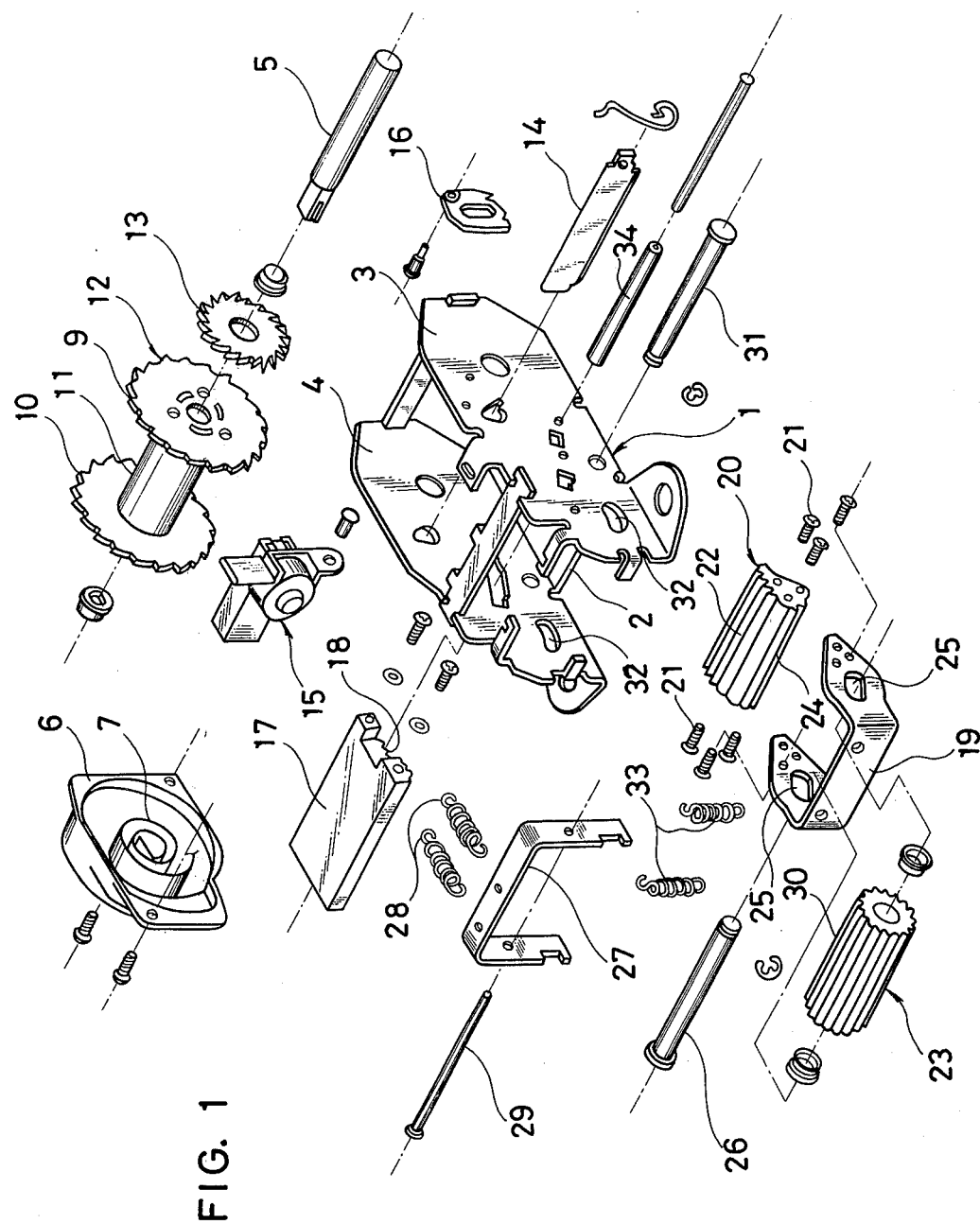
FIG. 1 is an exploded perspective view of the locking device for vehicle seat belt webbing according to a preferred embodiment of this invention.

Referring to the drawings, a housing 1 has a base plate 2 and a pair of side plates 3, 4 extending upright from both ends of the base plate 2. At upper parts of the side plates 3, 4, is rotatably supported a webbing take-up shaft 5, which is always urged by a take-up spring 7 enclosed in a spring cover 6 provided on the outer wall of the side plate 4 in such a direction that a webbing 8 is taken up (namely, in the counter clockwise direction in FIG. 2). On the take-up shaft 5, are integrally provided ratchet wheels 9, 10 and a spool 11, whereby constructing a reel 12. A ratchet gear 13 is attached to the outer side of the ratchet wheel 9.

Below the ratchet wheels 9, 10, a locking bar 14 is swingably provided between both side plates 3, 4.

On the inner wall of the side plate 3, there is provided acceleration or deceleration sensing means 15 (referred to generally as acceleration sensing means) adapted to detect a sudden speed change of a vehicle. As the sensing means 15, it is preferred to employ such sensing means as disclosed in U.S. Pat. No. 4,083,511 issued Apr. 11, 1978 and assigned to the present assignee, NSK-Warner K.K. In the event of an emergency such as a collision of a vehicle, an inertia member (not shown) is tilted sensing a sudden speed change of the vehicle and a ratchet lever 16 is turned counter-clockwise in FIG. 2 until it is brought into engagement with the ratchet gear 13. A pulling-out of the webbing 8 causes the locking bar 14 to engage with the ratchet wheel 9, 10, thereby restraining the reel 12 from any further clockwise rotation.

At the right hand side of the sensing means 15, a clamp plate 17 serving as clamp means is fixedly provided between the side plates 3, 4. The clamp plate 17 defines a knurled surface 18 to ensure the clamping of the webbing 8 in the event of an emergency. On the other hand, at the lower right side of the clamp plate 17, a swing arm 19 of turned square U-shaped configurations is displaceably provided. A swing clamp 20 of a substantially trigonal prism shape is fixedly secured on the swing arm 19 by means of screws 21. The swing clamp 20 defines a clamping surface 22 at a portion confronting or facing the knurled face 18 of the clamp plate 17. The swing clamp 20 also defines an engagement surface 24 for engagement with a drum 23 which will be described below.

The swing arm 19 defines in both side plates thereof slots 25, 25 respectively. Between both slots 25, 25, is journalled the drum which is rotatable about its shaft 26. Since a square U-shaped holding lever 27 kept in abutment with the shaft 26 at both ends thereof is biased clockwise (in FIG. 2) about a pin 29 by first springs 28,28, the drum 23 is normally kept in a non-engagement position with the swing clamp 20. On the outer circumferential surface of the drum 23, interlocking ridges 30 are formed so that the drum 23 moves along the slots 25, 25 when a tensile force of a predetermined level or greater is applied to the webbing 8 and the interlocking ridges 30 are eventually brought into engagement with the engagement surface 24 of the swing clamp 20. At the right hand side of the swing arm 19, a guide roller 31 is disposed between both side plates 3, 4 so as to restrain the swing arm 19 from turning clockwise and, in the event of an emergency, to guide the swing arm 19.

On the other hand, guide slots 32, 32 are formed in the side plates 3, 4 so as to guide the drum 23 and swing arm 19.

The swing arm 19 is always urged clockwise about the shaft 26 by means of second springs 33, 33. The biasing forces of the first springs 28, 28 also act on the swing arm 19 through the holding lever 27 and shaft 26. Thus, the swing arm 19 is also urged downwards (in FIG. 2).

Next, the operation of the locking device as constructed above will be described with reference to FIGS. 3 and 4.

Figure 2:
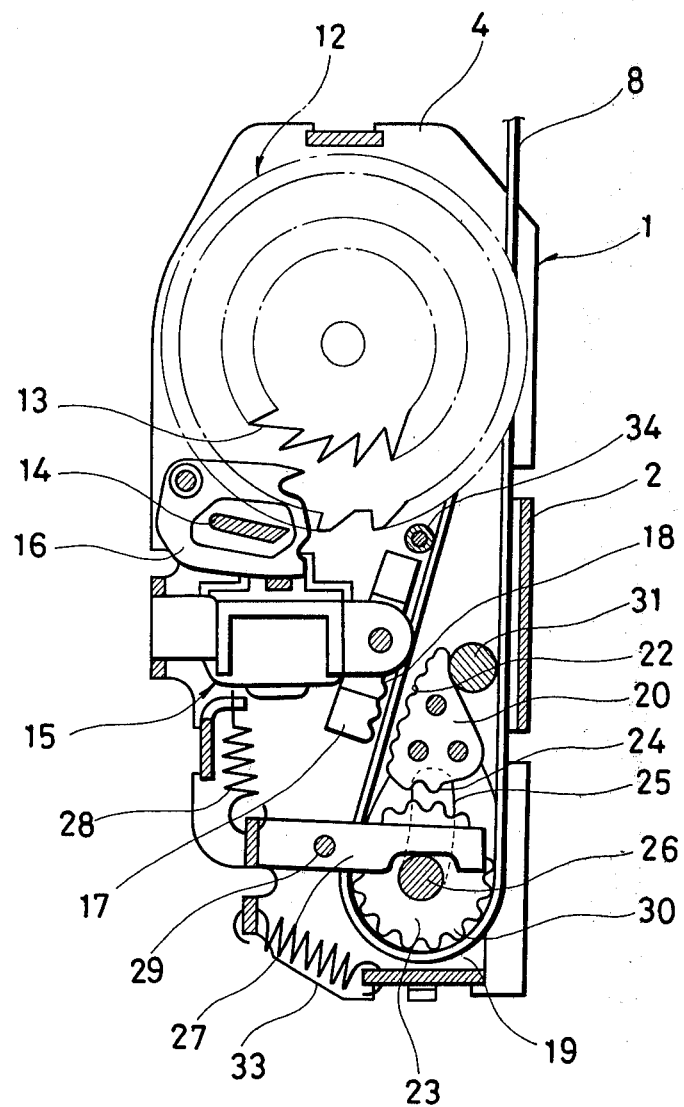
FIGS. 2 to 4 illustrate the operation of the locking device of FIG. 1.

As shown in FIG. 2, the webbing 12, which has been taken up on the reel 12, is normally guided upwardly by a guide roller 34 while maintaining its contact with the outer circumferential surface of the drum 23. The upwardly guided free end of the webbing 8 is sewed via an unillustrated tongue on an anchor plate which is in turn secured on the vehicle body. The webbing 8 is fastened by an occupant when he inserts the tongue into an unillustrated buckle, thereby loosely restraining the occupant. Here, there is formed between the clamp plate 17 and the clamping surface 22 of the swing clamp 20 a gap sufficiently wide to permit free passage of the webbing 8 therethrough. Thus, the webbing 8 is guided while contacting only with the guide roller and drum 23, both of which are rotatable freely. Accordingly, the webbing 8 is not practically subjected to a frictional resistance upon the pay-out or take-up thereof and its handling is easy and smooth.

When the sensing means 15 is actuated by detecting a vehicle speed change beyond a preset level in the event of an emergency, the ratchet lever 16 is brought into engagement with the ratchet gear 13. The ratchet lever 16 is lifted further by a clockwise turning of the reel 12, namely, the ratchet gear 13. This causes the locking bar 14 to engage with the ratchet wheels 9, 10, thereby to restrain the reel 12 from further rotation. By the way, the occupant continues to move forward from his seat due to inertia force and the webbing 8 is applied with a further pay-out force. However, since the reel 12 has already been restrained from rotation, the tensile force applied to the webbing 8 increases and, when it exceeds a predetermined level, the drum 23 moves first upwardly along the slots 25 of the swing arm 19 and interlocking ridges 30 are brought into engagement with the engagement surface 24 of the swing clamp 20. This state is shown in FIG. 3. As apparent from a comparison between FIG. 2 and FIG. 3, the swing arm 19 is kept at the same position as in the normal use of the locking device.

Figure 3:
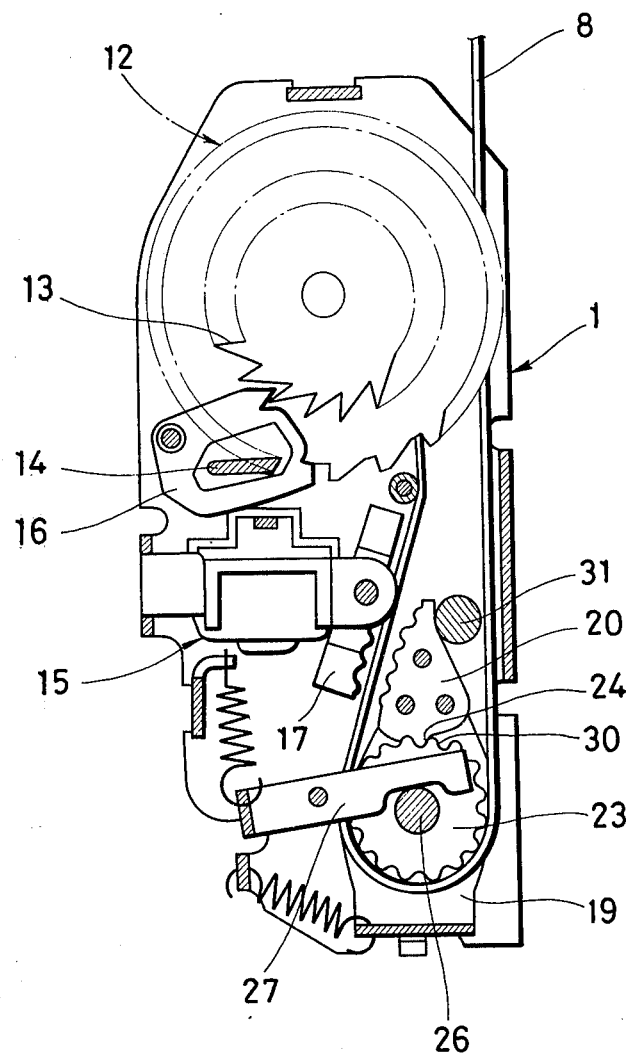
Figure 4:
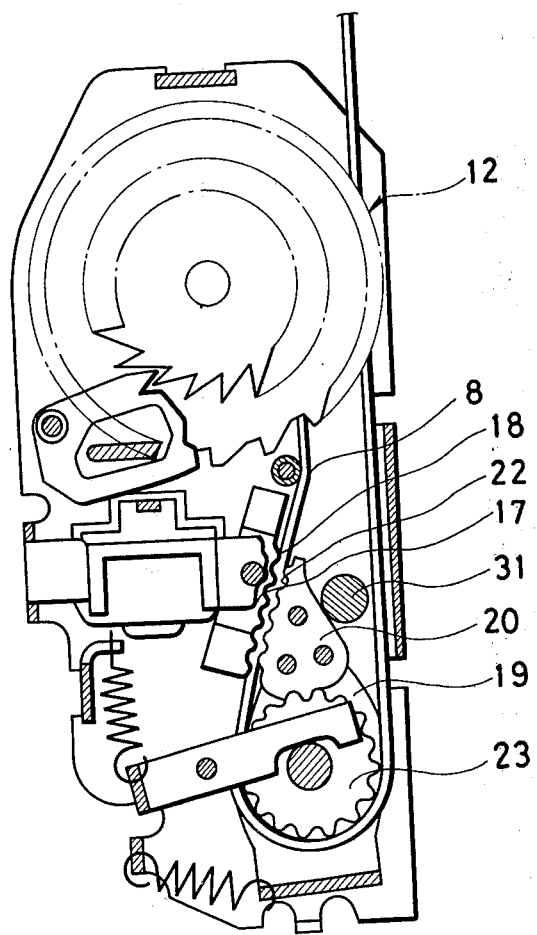

In the state shown in FIG. 3, the drum 23 is restrained from rotation and the frictional resistance between the drum 23 and the webbing, which is guided along the outer circumferential surface of the drum 23, is increased considerably. When a pay-out force is further exerted on the webbing 8, the swing arm 19 is displaced in an upper left direction under the guidance of the guide slots 32 formed in both side plates 3, 4 of the housing 1 and the guide roller 31 while maintaining the engagement of the drum 23 and swing clamp 20, and, as shown in FIG. 4, the webbing 8 is directly clamped between the clamp plate 17 and swing clamp 20. Thus, the webbing is restrained from further pay-out and the occupant is safely protected without tightening the webbing portion which has been taken up on the reel 12. At this time, the pay-out force produced by the inertia movement of the occupant is reduced by the frictional resistance between the webbing 8 and drum 23, thereby reducing the tensile force exerted at the webbing-clamping portion and thus carrying out the clamping action of the webbing 8 more effectively.

Furthermore, the swing clamp 20 of substantially trigonal (triangular) prism-like configurations is urged against the clamp plate 17 as if it is driven as a wedge between the clamp plate 17 and the guide roller 31. Owing to the wedge action of the swing clamp 20, a considerable clamping pressure is developed between the knurled surface 18 and clamping surface 22, whereby making the clamping action more reliable.

Having now fully described the invention, it will be apparent to one of ordinary skill in the art that many changes and modifications can be made thereto without departing from the spirit or scope of the invention as set forth herein.

What is claimed is:

1. A locking device for vehicle seat belt webbing, comprising a housing; a clamp member fixedly secured on the housing; a swing arm swingably supported on the housing; a swing clamp integrally secured on the swing arm having first and second surfaces which make an acute angle and being displaceable between a first position where the swing clamp permits free passage of the webbing and a second position where the webbing is clamped between the clamp member and the first surface so as to restrain the webbing from movement; guide means adapted to guide the swing clamp along the second surface thereof between the first position and the second position; a drum rotatably mounted on a shaft; which extends between slots formed in the swing arm, and displaceable while being guided by the slots between a non-engagement position where the drum is disengaged from the swing clamp and an engagement position where the drum is engaged with the swing clamp and prevented from rotation; and the drum being displaceable from the non-engagement position to the engagement position when a tensile force of at least a predetermined value is applied to the webbing and, when a further tensile force is exerted on the webbing, the swing arm moving toward the clamp member and the second surface of the swing clamp being guided by the guide means so that the swing clamp moves together with the drum which is at the engagement position, from the first position to the second position.

2. The locking device as claimed in claim 1, wherein the swing clamp defines an interlocking surface at a surface confronting the drum and the drum defines a knurled circumferential surface, whereby, when the drum assumes the engagement position, bringing the interlocking surface into engagement with the knurled circumferential surface so as to restrain the drum from rotation.

3. The locking device as claimed in claim 1, wherein the guide means is a guide roller so as to smoothly guide the swing clamp from the first position to the second position and firmly clamp the webbing by a wedge action of the swing clamp.

4. The locking device as claimed in claim 1, wherein the device further comprises a take-up reel rotatably mounted on the housing, an acceleration sensing device for detecting a sudden speed change of a vehicle on which the device is to be mounted, and locking means actuated by the sensing device to lock the take-up reel.

5. A locking device as claimed in claim 1, wherein the first surface of the swing clamp and a surface of said clamp member facing said first surface defines alternating ridges and moves respectively.

* * * * *